(12) United States Patent
Svanbro et al.

(10) Patent No.: US 6,950,445 B2
(45) Date of Patent: Sep. 27, 2005

(54) COMMUNICATION SYSTEM AND METHOD FOR SHARED CONTEXT COMPRESSION

(75) Inventors: Krister Svanbro, Lulea (SE); Johan Allden, Lulea (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 897 days.

(21) Appl. No.: 09/814,434

(22) Filed: Mar. 21, 2001

(65) Prior Publication Data

US 2002/0057716 A1 May 16, 2002

Related U.S. Application Data

(60) Provisional application No. 60/249,497, filed on Nov. 16, 2000.

(51) Int. Cl.[7] ................................................. H04J 3/18
(52) U.S. Cl. ...................................... 370/477; 709/247
(58) Field of Search ................................ 370/477, 474, 370/238, 310, 516, 521; 709/247, 200–211; 341/106, 51, 60–65, 87

(56) References Cited

U.S. PATENT DOCUMENTS

| | | | | |
|---|---|---|---|---|
| 5,258,983 A | * | 11/1993 | Lane et al. | 370/477 |
| 5,293,379 A | * | 3/1994 | Carr | 370/474 |
| 5,384,780 A | * | 1/1995 | Lomp et al. | 370/238 |
| 5,410,671 A | * | 4/1995 | Elgamal et al. | 711/202 |
| 5,537,551 A | * | 7/1996 | Denenberg et al. | 709/247 |
| 5,689,589 A | * | 11/1997 | Gormish et al. | 382/239 |
| 5,841,971 A | * | 11/1998 | Longginou et al. | 709/200 |
| 6,032,197 A | | 2/2000 | Birdwell et al. | 709/247 |
| 6,041,054 A | | 3/2000 | Westberg | 370/389 |
| 6,222,942 B1 | * | 4/2001 | Martin | 382/232 |
| 6,246,672 B1 | * | 6/2001 | Lumelsky | 370/310 |
| 6,300,887 B1 | * | 10/2001 | Le | 341/60 |
| 6,345,307 B1 | * | 2/2002 | Booth | 709/247 |
| 6,680,955 B1 | * | 1/2004 | Le | 370/477 |

FOREIGN PATENT DOCUMENTS

WO    WO 00/38098    6/2000

OTHER PUBLICATIONS

Luiz M. Alves Dos Santos, Multimedia Data and Tools for Web Services over Wireless Platforms, Oct. 1998, IEEE Personal Communication, vol. 5, No. 5, pp. 42–46.*

Alves dos Santos, "Multimedia Data and Tools for Web Services Over Wireless Platforms", *IEEE Personal Communications*, vol. 5, No. 5, Oct. 1, 1998, pp. 42–46.

PCT International Search Report for PCT/SE01/02551, Aug. 26, 2002.

Deutsch, P. "Deflate Compressed Data Format Specification version 1.3." IETF RFC 1951. (1996). pp. 1–17.

Bormann C., et al. (2000) Robust Header Compression (ROHC). Internet Draft (work in progress), Oct. 2000, <draft–ietf–rohc–rpt–05.txt> pp. 1–156.

* cited by examiner

*Primary Examiner*—Chi Pham
*Assistant Examiner*—Prenell Jones

(57) ABSTRACT

A system, method, and apparatus for increasing the efficiency of the compression of a communication protocol for use over bandwidth limited communication links. One aspect of the present invention provides for the sharing of context information between a compressor and decompressor at each communication entity in a communication system. As a result, context information will be shared for each channel pair. In another aspect of the present invention, multiple communication sessions between communication entities may share the same context information for the compression and decompression of communication messages.

27 Claims, 3 Drawing Sheets

COMMUNICATION SYSTEM AND METHOD FOR SHARED CONTEXT COMPRESSION

CROSS-REFERENCE TO RELATED APPLICATIONS

This patent application is related to and claims priority from U.S. Patent Application No. 60/249,497, filed Nov. 16, 2000 U.S. patent application Ser. No. 09/814,406, filed concurrently herewith, entitled "Statio Information Knowledge Used With Binary Compression Method" U.S. patent application Ser. No. 09/814,407, filed concurrently herewith, entitled "Communication System and Method Utilizing Request-Repy Communication Patterns For Data Compression" and U.S. patent application Ser. No. 09/814,268, filed concurrently herewith, entitled "System and Method For Communication With Temporary Compression Tables".

BACKGROUND OF THE INVENTION

1. Technical Field of the Invention

The present invention relates to the compression of messages in communications using data protocols, e.g. Internet protocols.

2. Background and Objects of the Present Invention

Two communication technologies that have become widely used by the general public in recent years are cellular telephony and the Internet. Some of the benefits that have been provided by cellular telephony have been freedom of mobility and accessability with reasonable service quality despite a user's location. Until recently the main service provided by cellular telephony has been speech. In contrast, the Internet, while offering flexibility for different types of usage, has been mainly focused on fixed connections and large terminals. However, the experienced quality of some services, such as Internet telephony, has generally been regarded as quite low.

A number of Internet Protocols (IPs) have been developed to provide for communication across the Internet and other networks. Still another example of such an Internet protocol is the Session Initiation Protocol (SIP), which is an application layer protocol for establishing, modifying, and terminating multimedia sessions or calls. These sessions may include Internet multimedia conferences, Internet telephony, and similar applications. As is understood in the art, SIP can be used over either the Transmission Control Protocol (TCP) or the User Datagram Protocol (UDP).

Another example of an Internet Protocol is the Real Time Streaming Protocol (RTSP), which is an application level protocol for control of the delivery of data with real-time properties, such as audio and video data. RTSP may also be used with UDP, TCP, or other protocols as a transport protocol. Still another example of an Internet Protocol is the Session Description Protocol (SDP), which is used to advertise multimedia conferences and communicate conference addresses and conference tool-specific information. SDP is also used for general real-time multimedia session description purposes. SDP is carried in the message body of SIP and RTSP messages. SIP, RTSP, and SDP are all ASCII text based using the ISO 10646 character set in UTF-8 encoding.

Due to new technological developments, Internet and cellular telephony technologies are beginning to merge. Future cellular devices will contain an Internet Protocol (IP) stack and support voice over IP as well as web-browsing, e-mail, and other desirable services. In an "all-IP" or "IP all the way" implementation, Internet Protocols are used end-to-end in the communication system. In a cellular system this may include IP over cellular links and radio hops. Internet Protocols may be used for all types of traffic including user data, voice or streaming data, and control data, such as SIP or RTSP data. Such a merging of technologies provides for the flexibility advantages of IP along with the mobility advantages of cellular technology.

As is understood in the art, the SIP, RTSP, and SDP protocols share similar characteristics which have implications in their use with cellular radio access. One of these similarities is the general request and reply nature of the protocols. Typically, when a sender sends a request, the sender stays idle until a response is received. Another similarity, as previously described, is that SIP, RTSP, and SDP are all ASCII text based using the ISO 10646 character set with UTF-8 encoding. As a result, information is usually represented using a greater number of bits than would be required in a binary representation of the same information. Still another characteristic that is shared by the protocols is that they are generally large in size in order to provide the necessary information to session participants.

A disadvantage with IP is the relatively large overhead the IP protocol suite introduces due to large headers and text-based signaling protocols. It is very important in cellular systems to use the scarce radio resources in an efficient manner. In cellular systems it is important to support a sufficient number of users per cell, otherwise implementation and operation costs will be prohibitive. Frequency spectrum, and thus bandwidth, is a costly resource in cellular links and should be used efficiently to maximize system resources.

In the UMTS and EDGE mobile communication systems and in future releases of second generation systems, such as GSM and IS-95, much of the signaling traffic will be performed by using Internet protocols. However as discussed, most of the Internet protocols have been developed for fixed, relatively broadband connections. When access occurs over narrow band cellular links, compression of the protocol messages is needed to meet quality of service requirements such as set-up time and delay. Typically, compression over the entire communication path is not needed. However, compression of traffic over the radio link, such as from a wireless user terminal to a core network, is greatly desirable.

Standard binary compression methods, such as Lempel-Ziv and Huffman coding, are very general in the sense that they do not utilize any explicit knowledge of the structure of the data to be compressed. The use of such methods on Internet data protocols, e.g., SIP and RTSP, present difficulties for the efficient compression of communication messages. Standard binary compression methods available today are typically designed for large data files. As a consequence, use of such methods for the compression of small messages or messages with few repeated strings results in compression performance generally regarded as very poor. In fact, if the message to be compressed is small and/or contains few repeated strings, the use of some standard compression methods may result in a compressed packet which is actually larger than the original uncompressed packet, thereby achieving a counterproductive result.

One method for implementing a binary compression scheme is the use of dictionary based compression techniques. In general, a dictionary compression scheme uses a data structure known as a dictionary to store strings of symbols which are found in the input data. The scheme reads in input data and looks for strings of symbols which match those in the dictionary. If a string match is found, a pointer or index to the location of that string in the dictionary is output and transmitted instead of the string itself. If the index is smaller than the string it replaces, compression will occur. A decompressor contains a representation of the compressor dictionary, so that the original string may be reproduced from the received index. An example of a dictionary compression method is the Lempel-Ziv (LZ77) algorithm. This algorithm operates by replacing character strings which have previously occurred in the file by references to the previous occurrence. This method is, of course, particularly successful in files where repeated strings are common.

Dictionary compression schemes may be generally categorized as either static or dynamic. A static dictionary is a predefined dictionary, which is constructed before compression occurs, and which does not change during the compression process. Static dictionaries are typically either stored in the compressor and decompressor prior to use, or transmitted and stored in memory prior to the start of compression operations.

A dynamic or adaptive dictionary scheme, on the other hand, allows the contents of the dictionary to change as compression occurs. In general, a dynamic dictionary scheme starts out with either no dictionary or a default, predefined dictionary and adds new strings to the dictionary during the compression process. If a string of input data is not found in the dictionary, the string is added to the dictionary in a new position and assigned a new index value. The new string is transmitted to the decompressor so that it can be added to the dictionary of the decompressor. The position of the new string does not have to be transmitted, as the decompressor will recognize that a new string has been received, and will add the string to the decompressor dictionary in the same position in which it was added in the compressor dictionary. In this way, a future occurrence of the string in the input data can be compressed using the updated dictionary. As a result, the dictionaries at the compressor and decompressor are constructed and updated dynamically as compression occurs.

One method of dictionary compression is of the type known as sliding window compression. In this method the compressor moves a fixed-size sliding window from left to right through the file during compression. The compression algorithm searches the file to the left of the window for matches to strings currently in the window. If a match is found the string is replaced by a reference to the location of the match within the file along with a reference to the length of the match. Alternately, the window may be a text window of a large block of recently decoded text and a look-ahead buffer. In this version, the look-ahead buffer is used to search for matches within the text window. If a match is found the string is replaced by a reference to the location of the match within the text window and reference to the length of the match. This information is used by the decompressor which maintains the same dictionary to reproduce the original information.

Another method for the compression of data is the use of a binary code tree. In a binary code tree, symbols or strings which are to be compressed are represented in a tree structure by a variable number of bits such that each symbol is uniquely decodable. Typically, symbols with higher probabilities of occurrence in the input data are represented by a shorter number of bits than those which have lower probabilities of occurrence. In the construction of the binary code tree, individual symbols are laid out as a string of leaf nodes connected to a binary tree. Symbols with higher probabilities of occurrence are represented as shorter branches of the tree resulting in a fewer number of bits being required to represent them. Conversely, symbols with lower probabilities of occurrence are represented as longer branches of the tree requiring a greater number of representation bits. When a string of input data matches a symbol in the binary code tree of the compressor, the code of the symbol is transmitted instead of the symbol itself resulting in data compression. A decompressor receiving the code reconstructs the original symbol or string using an identical binary code tree.

Similarly to dictionary compression, binary code trees may be static or dynamic. In a static binary code tree scheme, a predefined binary code tree is constructed prior to compression and does not change during the compression process. As with static dictionaries, static binary code trees may be stored in the compressor and decompressor in advance, or transmitted and stored prior to the start of compression.

A dynamic or adaptive binary code tree allows for the addition of new symbols or strings to the code tree during the compression process. Various methods may be used to update the nodes of the tree according to the type of binary code tree compression used to allow for the addition of new symbols and the rearrangement of the code tree. The binary code tree in the decompressor must also be updated according to the same rules as the binary code tree in the compressor.

One example of a binary code tree compression scheme is that of a Huffman coding compression scheme. Huffman compression is a general compression method intended primarily for compression of ASCII files. Characters occurring frequently in the files are replaced by shorter codes, i.e. codes with less than the 8 bits used by the ASCII code. Huffman compression can be successful in files where relatively few characters are used.

A general criteria for successful compression using the aforementioned binary compression algorithms is that the file to be compressed is reasonably large. The codes for Huffman compression must not be too large compared to the file which is being compressed. For standard Lempel-Ziv compression, the file to be compressed must be large enough to have many repeated strings to achieve efficient compression. The messages produced by the aforementioned protocols are mostly a few hundred bytes and not large enough to allow efficient compression with the aforementioned algorithms on a message by message basis.

One technique for compressing communication messages is that of header compression. Header compression is used to reduce the size of a communication message or packet by removing or reducing the size of header fields within the communication message. Header compression relies on many fields of a header remaining constant or changing very little in consecutive packets belonging to the same packet stream. Fields that do not change between packets do not need to be transmitted at all, whereas fields that change often with small and/or predictable values can be encoded incrementally so that the number of bits needed for these fields may be significantly decreased. Only fields that change often and randomly, such as checksums or authentication data, need to be transmitted in every header. Header compression is performed in such a way that a decompressor can reconstruct the header if its context state is identical to the context state used when compressing the header.

In header compression techniques, the context state is the state which a compressor uses to compress a header and a decompressor uses to decompress a compressed header. The context contains relevant information from the current and previous headers in the current packet stream, such as static fields and possible reference values for compression and decompression. Additional information describing the packet stream, such as information about how the IP identifier field changes and the typical inter-packet increase in sequence numbers or timestamps, may also be part of the context.

The context may include both a static and dynamic part. The static part includes static fields that are expected to be constant throughout the lifetime of the packet stream. Examples of static fields within an Internet Protocol Version 6 (IPv6) header include the IP (Internet Protocol) version field, flow label field, payload length field, next header field, source IP address, and destination IP address. The dynamic part includes fields within the header which are expected to vary within the packet stream. Examples of dynamic IPv6 header fields include the traffic class field and the hop limit field.

Examples of static header fields within an Internet Protocol Version 4 (IPv4) packet stream include the IP version field, the protocol field, the source IP address, and the destination IP address. Examples of dynamic header fields within an IPv4 packet stream include the type-of-service field, the time-to-live field, and the identification field. Examples of static UDP (User Datagram Protocol) header fields include the source port field and the destination port field. An example of a static field within a RTP (Real-time Transport Protocol) header includes the sending source (SSRC) field.

The aforedescribed packet stream is a sequence of packets whose headers are similar and share context information, such as a common source and destination address. The context information for a packet stream is associated with a context identifier (CID). The context identifier (CID) is a small unique number identifying the context that should be used to decompress a compressed header within the packet stream. The context information is conceptually stored in a table which is indexed using the context identifier (CID). The context identifier (CID) is carried in both full headers and compressed headers during the transmission of communication messages.

The general principle of header compression is to occasionally send a packet with a full, uncompressed header including the context information of the current communication message. Packet headers used in subsequent communication messages refer to the context established by the full header and may include incremental changes to the context. Compression of the communication messages is achieved because the full context information does not have to be included in the subsequent messages which use the same context information.

A need exists in the art for increasing the efficiency and performance of the signalling protocols used for compression of messages over bandwidth limited communication links and channels.

SUMMARY OF THE INVENTION

The present invention is directed to a method, system, and apparatus for increasing the efficiency of the compression of a communication protocol for use over bandwidth limited communication links. One aspect of the present invention provides for the sharing of context information between a compressor and decompressor at each communication entity in a communication system. As a result, context information will be shared for each channel pair. In another aspect of the present invention, multiple communication sessions between communication entities may share the same context information for the compression and decompression of communication messages.

BRIEF DESCRIPTION OF THE DRAWINGS

A more complete understanding of the system, method and apparatus of the present invention may be had by reference to the following Detailed Description when taken in conjunction with the accompanying Drawings wherein.

DETAILED DESCRIPTION OF THE PRESENTLY PREFERRED EXEMPLARY EMBODIMENTS

The present invention will now be described more fully hereinafter with reference to the accompanying Drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
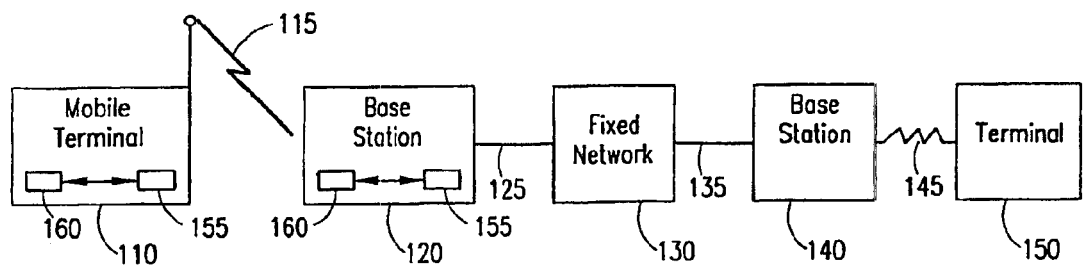
FIG. 1 illustrates an exemplary system for communication in accordance with the present invention.

FIG. 1 illustrates an exemplary system for communication in accordance with the present invention. A mobile terminal 110 is in communication with a base station 120 using communication protocols over a communication link 115, e.g. a wireless link. The base station 120 is in communication with a fixed network 130, such as a PSTN, via a link 125. Fixed network 130 is in communication with a base station 140 via a link 135. Base station 140 is in communication with a terminal 150, which may be a mobile terminal or a fixed terminal, using communication link 145.

According to an embodiment of the present invention, the mobile terminal 110 communicates with the base station 120 using compressed messages with associated context information, using a compression methodology such as using a header compression scheme or a binary compression scheme, over the communication link 115. Similarly, base station 140 may communicate with terminal 150 using compressed messages with associated context information. It should be understood that components in the system of FIG. 1, such as mobile terminal 110 and base station 140, may include a memory 160 and processor 155 used for storing and executing software instructions which implement compression and decompression algorithms. It should also be understood that the present invention may be used in other communication systems, such as a cellular network, that use communication protocols having context information over links in which compression is desired.

Figure 2:
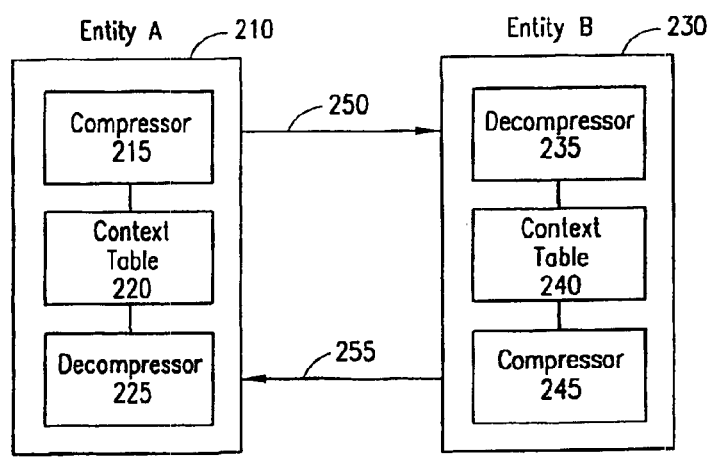
FIG. 2 illustrates an exemplary embodiment for sharing context information in accordance with the present invention.

FIG. 2 illustrates an exemplary embodiment for sharing context information in accordance with the present invention. In this embodiment, an entity A (210) is in communication with an entity B (230) using communication links (250, 255) with a communication protocol in which data compression is used. According to the exemplary embodiment, communication links 250 and 255 comprise a channel pair. As illustrated in FIG. 2, entity A (210) includes a compressor 215 for compressing messages to be transmitted to entity B (230) over communication link 250, and a decompressor 225 for decompressing data received from entity B (230) over communication link 255. In addition, entity A (210) includes a context table 220, associated with compressor 215 and decompressor 225, for storing context information. It should be understood that the compressor and/or decompressor may be implemented using a processor and associated memory having stored therein instructions for a compression/decompression algorithm(s). It should also be understood that the communication entities may comprise a number of communication devices. For example, entity A (210) may comprise a mobile terminal, and entity B (230) may comprise a base station.

As further illustrated in FIG. 2, entity B (230) includes a decompressor 235 for decompressing messages received from communication link 250, and a compressor 245 for compressing messages to be transmitted over communication link 255. Entity B (230) also contains a context table 240, associated with decompressor 235 and compressor 245, for storing context information.

During operation, compressor 215 and decompressor 225 of entity A (210) share the same context table 220. The context table includes context information which is used for both the compression and decompression of communication messages sent and received over the channel pair (250,255). Similarly, decompressor 235 and compressor 245 of entity B (230) share the same context table 240, which is shared for both the decompression and compression of communication messages.

Thus, instead of having a separate context for each communication channel, the exemplary embodiment in accordance with the present invention provides for a shared context for each channel pair. By sharing the context table between the compressor and decompressor at each entity, both the compressor and decompressor at each entity are able to update the context information in the context table from both sent and received communication messages. Because context information in both sent messages and received messages is used to update the context information, the compression efficiency may be increased.

In accordance with an embodiment of the present invention, the context information stored in a context table may include any information needed to compress and decompress communication messages. For field compression techniques, such as the aforedescribed header compression techniques, the context information may include specific fields contained in the communication message. For binary compression techniques, such as that of dictionary compression, the context may include the dictionaries or tables used by the method. For example, the context information may include messages or parts of messages which would be useful to save in dictionaries for use during compression and decompression.

Figure 3:
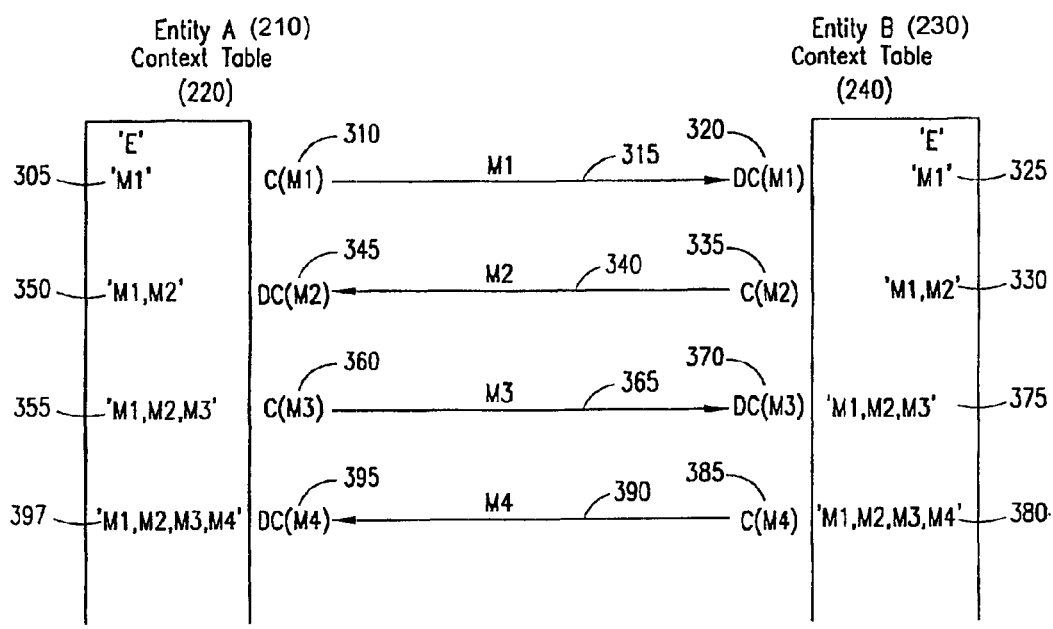
FIG. 3 illustrates an exemplary methodology of updating context information in accordance with the present invention.

In FIG. 3 is illustrated an exemplary method of updating context information in accordance with the present invention. In the exemplary illustration of FIG. 3, flow arrows indicate the message flow (M1–M4) between entity A (210) and entity B (230) during an exemplary communication session. In the exemplary illustration, each of communication messages M1–M4 contain new context information which is desired to be stored in the context tables of each communication entity. The context table columns indicate the contents of entity A's context table (220) and entity B's context table (240) at given instances during the communication session. The notation of "E" represents an empty context within the context table, while the notation "Mn" represents the context information of message Mn as being stored in the context table. The notations of C(Mn) and DC(Mn) represent the respective compression and decompression of message Mn using the context information located in the current context table.

In this exemplary illustration, entity A (210) and entity B (230) begin with context tables (220, 240) containing empty context information, "E", prior to the start of the communication session. Entity A (210) prepares to send a first communication message, M1, to entity B (230). The context information, "M1", related to message M1 is added to context table 220 (step 305). Message M1 is then compressed using the context information, "M1", from context table 220 (step 310). Entity A (210) then sends the compressed message M1, which includes the context information, "M1", associated with message M1, to entity B (230) (step 315). After receiving the compressed message M1, entity B (230) decompresses compressed message M1 using the "M1" context information (step 320). Entity B (230) then adds the "M1" context information to its context table 240 (step 325).

When entity B (230) prepares to send a communication message M2, to entity A (210), entity B (230) adds the context information, "M2", related to message M2 to the context table 240 (step 330). As a result, context table 240 will now contain the "M1, M2" context information. Message M2 is then compressed using the context information, "M1, M2", from context table 240 (step 335). After compression, entity B (230), sends the compressed message M2, which includes the context information, "M2", associated with message M2, to entity A (210) (step 340). After receiving the compressed message M2, entity A (210) decompresses compressed message M2 using the "M1, M2" context information (step 345). Entity A (210) then adds the "M2" context information to its context table 220 (step 350), so that context table 220 now contains context information "M1, M2".

Further communication between entity A (210) and entity B (230) are performed in the same manner. For example, entity A (210) prepares to send another communication message M3 to entity B (230) by first adding the context information, "M3", related to message M3 to the context table 220 (step 355). Message M3 is then compressed using the context information, "M1, M2, M3", from context table 220 (step 360). Entity A (210) then sends the compressed message M3, which includes the context information, "M3", associated with message M3, to entity B (230) (step 365). After receiving the compressed message M3, entity B (230) decompresses compressed message M3 using the "M1, M2, M3" context information (step 370). Entity B (230) then adds the "M3" context information to its context table 240 (step 375).

When entity B (230) sends another communication message M4 to entity A (210), entity B (230) adds the context information, "M4", related to message M4 to the context table 240 (step 380). As a result, context table 240 will now contain the "M1, M2, M3, M4" context information. Message M4 is then compressed using the context information, "M1, M2, M3, M4", from context table 240 (step 385). After compression, entity B (230), sends the compressed message M4, which includes the context information, "M4", associated with message M4, to entity A (210) (step 390). After receiving the compressed message M4, entity A (210)

decompresses compressed message M4 using the "M1, M2, M3, M4" context information (step 395). Entity A (210) then adds the "M4" context information to its context table 220 (step 397), so that context table 220 now contains context information "M1, M2, M3, M4".

As should be understood by the foregoing description, both communication entities maintain identically updated context tables for compression and decompression of communication messages. When communication messages are transmitted which contain the same context information as that of a previous message which has been stored in the context table, a context identifier may be substituted for the context information by the compressor to generate the compressed message. As a result, a decompressor may use the context identifier to decompress the message using the same context information.

Figure 4:
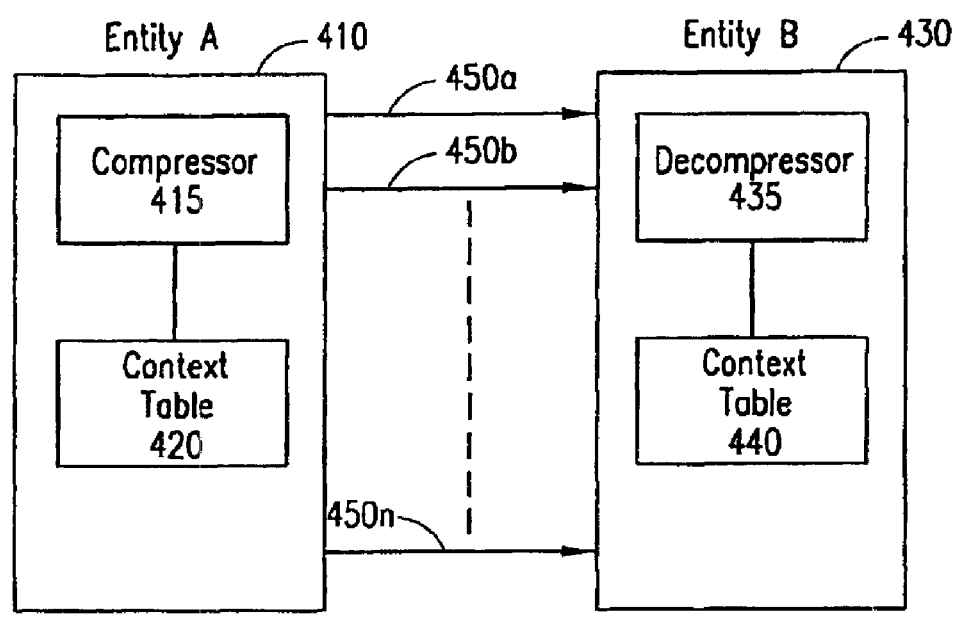
FIG. 4 illustrates another exemplary embodiment for sharing context information in accordance with the present invention.

FIG. 4 illustrates another exemplary embodiment for sharing context information in accordance with the present invention. In this embodiment an entity A (410) communicates with an entity B (430) using a number of communication sessions (450a, . . . , 450n) with a communication protocol. Entity A (410) sends communication messages which have been compressed using context information to entity B (430). As illustrated in FIG. 4, entity A (410) includes a compressor 415 for compressing messages to be transmitted to entity B (430) using communication sessions (450a, . . . , 450n). In addition, entity A (410) contains a context table 420 associated with compressor 415. The context table 420 includes context information used for the compression of messages which are sent using communication sessions (450a, . . . , 450n). Again, it should be understood that the communication entities may be a number of communication devices. For example, entity A (410) may comprise a mobile terminal, and entity B (430) may comprise a base station.

As further illustrated in FIG. 4, entity B (430) contains a decompressor 235 for decompressing communication messages received from entity A (410) using communication sessions (250a, . . . 250n). In addition, entity B (430) contains a context table 440 associated with decompressor 235. Context table 440 includes context information associated with the compressed messages which are sent using communication sessions (450a, . . . , 450n) so that the same context information that was used to compress the communication messages can be used to decompress them.

During operation, compressor 415 of entity A (410) uses context table 420 for compression of the messages to be sent to entity B (430) over communication sessions (450a, . . . , 450n). Decompressor 435 of entity B (430) uses context table 440 for decompression of the compressed messages received from entity A (410) over communication sessions (450a, . . . , 450n). Instead of having one context for each communication session, the exemplary embodiment of FIG. 4 allows the same context information to be can shared among multiple sessions, resulting in greater compression efficiency. For example, it may be necessary to send context information only once for one of the communication sessions, while the same context information may be used for the compression and decompression of messages for all of the communication sessions. Examples of context information which may be shared among multiple communication sessions between entity A (410) and entity B (430) include the IP destination address, the IP-source address, the IP-version number, etc.

It should be understood that various modifications and additions may be made in accordance with embodiments of the present invention. For example, in the case in which there is more than one logical link between communication entities, it may be necessary to identify which channels are associated with one another and share a context. An example of channels which may need to be associated with one another to share context information are request and response channels. Such an identification may be achieved through the use of channel mapping. One methodology of implementing channel mapping may be achieved by assigning an identifier for each channel pair. The channel pair identifier may then be included in each communication packet which is sent over associated communication channels. It should be understood that an identifier may also be used to associate any number of channels or sessions with one another in a communication session.

Although various embodiments of the method, system, and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the scope of the invention as set forth and defined by the following claims.

What is claimed is:

1. A communication entity for facilitating compressed message communication, said communication entity comprising:

a context table containing context information associated with at least one communication message;

a compressor, in communication with said context table, said compressor using said context information to compress at least one transmitted communication message;

a decompressor, in communication with said context table, said decompressor using said context information to decompress at least one received communication message; and said compressor and said decompressor both share said context table and both update said context table using context information within said at least one transmitted communication message and said at least one received communication message.

2. The communication entity of claim 1, wherein said context information comprises at least a portion of at least one information field of said at least one communication message.

3. The communication entity of claim 2, wherein said at least a portion of said at least one information field comprises at least one header field.

4. The communication entity of claim 3, wherein said at least one header field comprises at least one Internet Protocol header field.

5. The communication entity of claim 1, wherein said context information comprises a dictionary.

6. The communication entity of claim 1, wherein said at least one transmitted communication message is transmitted using a first communication channel and said at least one received communication message is received over a second communication channel, said first communication channel and said second communication channel comprising a channel pair.

7. The communication entity of claim 1, wherein said communication entity comprises a mobile terminal.

8. The communication entity of claim 1, wherein said communication entity comprises a communication node.

9. The communication entity of claim 1, wherein said at least one transmitted communication message is compressed using a first context, and said at least one received communication message is decompressed using a second context.

10. The communication entity of claim 9, wherein said first context is substantially the same as said second context.

11. A method for enabling a communication entity to facilitate compressed message communication, said method comprising the steps of:
- maintaining a context table containing context information associated with at least one communication message;
- compressing at least one transmitted communication message using said context information;
- decompressing at least one received communication message using said context information; and
- updating said context table using context information in said at least one transmitted communication message and said at least one received communication message.

12. The method of claim 11, wherein said context information comprises at least one information field of said at least one communication message.

13. The method of claim 12, wherein said at least one information field comprises at least one header field.

14. The method of claim 13, wherein said at least one header field comprises at least one Internet Protocol header field.

15. The method of claim 11, wherein said context information comprises a dictionary.

16. A method for enabling a communication entity to facilitate compressor message communication, said method comprising the steps of:
- compressing a first communication message having first context information to produce a first compressed message;
- storing said first context information in a context table;
- transmitting said first compressed message over a first communication channel;
- receiving a second compressed message over a second communication channel;
- decompressing said second compressed message to produce a second communication message having second context information; and
- storing said second context information in said context table, wherein said context table is updated by using said first context information and said second context information respectively associated with said first compressed message and said second compressed message.

17. The method of claim 16, wherein said first communication channel and said second communication channel comprising a channel pair.

18. The method of claim 16, wherein at least one of said first context information and said second context information comprises at least one information field of an Internet Protocol.

19. The method of claim 18, wherein said at least one information field comprises at least one header field.

20. The method of claim 16, wherein at least one of said first context information and said second context information forms an entry in a dictionary.

21. A method for enabling a first communication entity to facilitate multiple compressed message communication session with a second communication entity, wherein said first communication entity performs the following steps:
- maintaining a first context table containing context information associated with at least one communication message;
- compressing and transmitting a first communication message using the first context table;
- compressing and transmitting a second communication message using the first context table;
- receiving and decompressing a third communication message using the first context table;
- receiving and decompressing a fourth communication message using the first context table; and
- updating the first context table using context information in the first, second third and fourth communication messages.

22. The method of claim 21, wherein said second communication entity performs the following steps:
- maintaining a second context table containing context information associated with the at least one cummunication meassage;
- receiving and decompressing the first communication message using the second context table;
- receiving and decompressing the second communication message using the second context table;
- compressing and transmitting the third communication message using the second context table;
- compressing and transmitting the fourth communication message using the second context table; and
- updating the second context table using context information in the first second third and fourth communication message.

23. The communication entity of claim 1, wherein said context information is used to enable both header compression and signaling compression.

24. The communication entity of claim 1, wherein said context information comprises a header compression context.

25. The communication entity of claim 1, wherein said context information comprises a signaling compression dictionary.

26. The communication entity of claim 2, wherein said at least one header field comprises a fixed size header field.

27. The communication entity of claim 2, wherein said at least one header field comprises a variable size header field.

* * * * *